(12) United States Patent
Chen et al.

(10) Patent No.: US 7,494,593 B1
(45) Date of Patent: Feb. 24, 2009

(54) METHOD FOR FORMING A CANTILEVER AND TIP

(75) Inventors: Chien-Hua Chen, Corvallis, OR (US); John Chen, Corvallis, OR (US); Sriram Ramamoorthi, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 112 days.

(21) Appl. No.: 10/879,971

(22) Filed: Jun. 28, 2004

(51) Int. Cl.
*C25F 3/12* (2006.01)
(52) U.S. Cl. .............................. 216/2; 216/11; 216/62
(58) Field of Classification Search ............... None
See application file for complete search history.

(56) References Cited

U.S. PATENT DOCUMENTS

| | | | | |
|---|---|---|---|---|
| 4,968,585 A | * | 11/1990 | Albrecht et al. | 430/320 |
| 5,026,437 A | * | 6/1991 | Neukermans et al. | 148/33.3 |
| 5,594,166 A | * | 1/1997 | Itoh et al. | 73/105 |
| 5,614,663 A | * | 3/1997 | Itoh et al. | 73/105 |
| 5,618,760 A | * | 4/1997 | Soh et al. | 438/703 |
| 5,633,455 A | | 5/1997 | Quate | |
| 5,856,672 A | * | 1/1999 | Ried | 250/306 |
| 5,959,200 A | * | 9/1999 | Chui et al. | 73/105 |
| 6,000,947 A | * | 12/1999 | Minne et al. | 438/759 |
| 6,066,265 A | | 5/2000 | Galvin et al. | |
| 6,136,208 A | * | 10/2000 | Chou et al. | 216/2 |
| 6,156,216 A | * | 12/2000 | Manalis et al. | 216/11 |
| 6,428,713 B1 | | 8/2002 | Christenson et al. | |
| 6,458,206 B1 | * | 10/2002 | Givargizov et al. | 117/101 |
| 6,886,395 B2 | * | 5/2005 | Minne | 73/105 |
| 7,010,966 B2 | * | 3/2006 | Kitazawa et al. | 73/105 |
| 2002/0178799 A1 | * | 12/2002 | Kitazawa et al. | 73/105 |

FOREIGN PATENT DOCUMENTS

WO WO 03/087709 10/2003

* cited by examiner

*Primary Examiner*—Allan Olsen

(57) ABSTRACT

A method is disclosed for forming a single crystal cantilever and tip on a substrate. The method can include the operation of defining an implant area on the substrate with a layer of photoresist. A further operation can be implanting oxygen into the substrate in the implant area to a predetermined depth to form a buried oxide layer. The buried oxide layer can define a bottom of the single crystal cantilever and tip. Another operation can involve shaping the single crystal cantilever and tip from the substrate above the buried oxide layer.

22 Claims, 15 Drawing Sheets

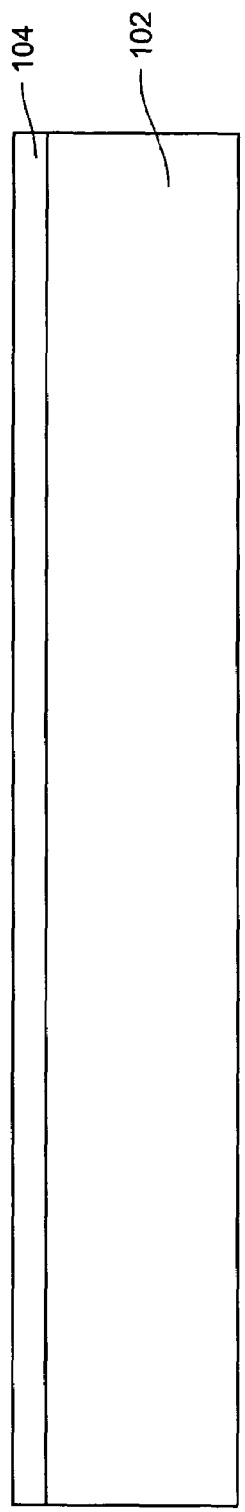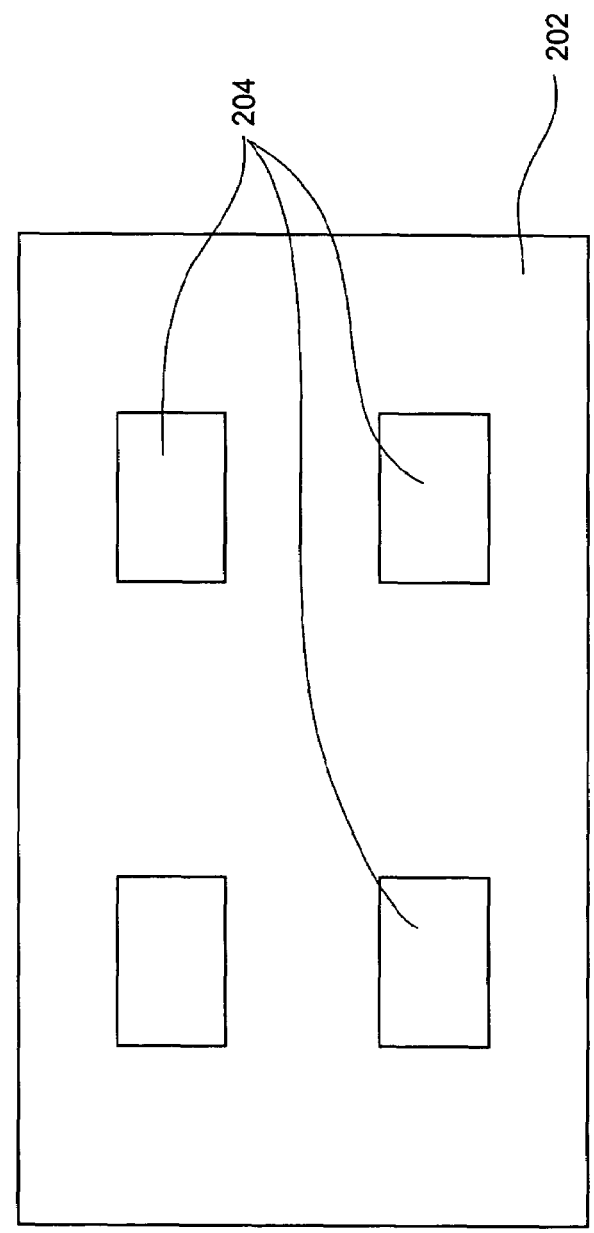

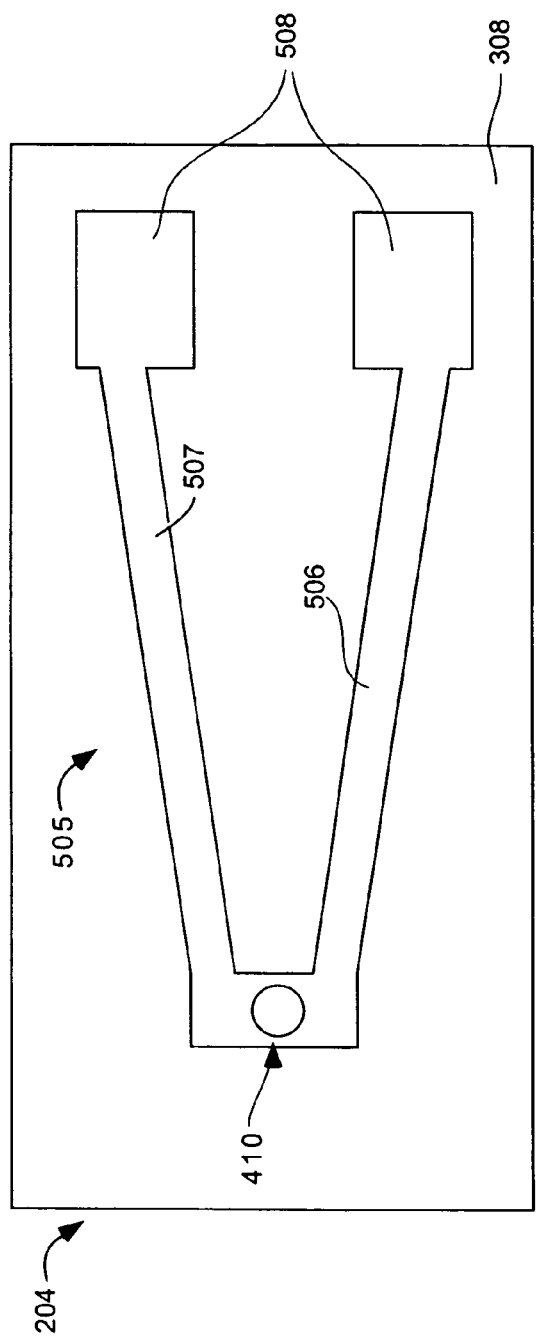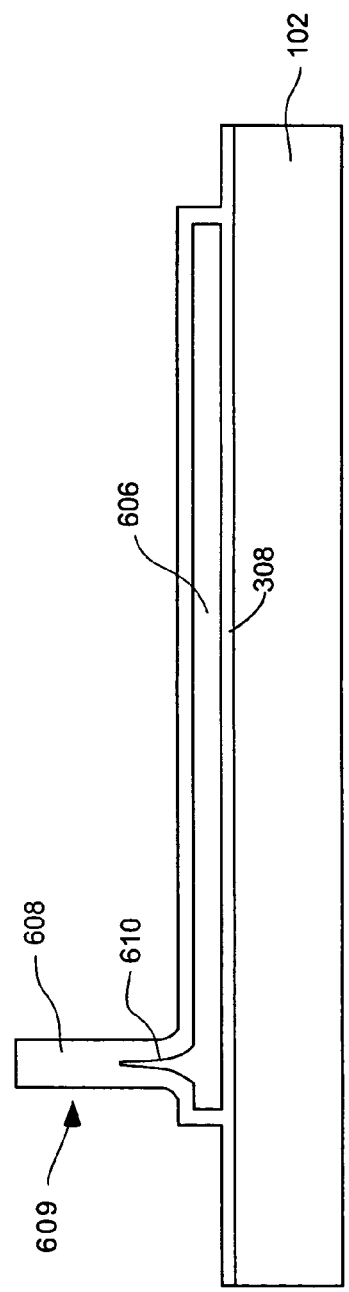
FIG. 5
FIG. 6

METHOD FOR FORMING A CANTILEVER AND TIP

FIELD OF THE INVENTION

The present invention relates generally to the formation of MEMS devices. More specifically, the invention relates to cantilever and tip formation.

BACKGROUND

Presently, micro-structure devices called MEMS (micro-electro-mechanical systems) are gaining popularity in the microelectronics industry. Such MEMS devices include, for example, micro-mechanical filters, pressure micro-sensors, micro-gyroscopes, micro-resonators, actuators, rate sensors, and acceleration sensors. These MEMS devices are created by microfabrication processes and techniques sometimes referred to as micromachining. These processes involve the formation of discrete shapes in a layer of semiconductor material by trenching into the layer with an etch medium. Because MEMS typically require movement of one or more of the formed shapes relative to others, the trenching is done in part over a cavity and in part over a substrate or bonding layer.

MEMS technology can be used to form scanning probe microscopes. Scanning probe microscopes are non-optical microscopes that use small probe tips to make measurements of a surface. One type of scanning probe microscope is the atomic force microscope. The probe tips for atomic force microscopes are typically based on micromachined silicon. In a typical probe tip arrangement, a sharpened silicon tip structure is formed at the end of a cantilever beam. Very fine surface features on a sample may be resolved using this type of microscope. Surface measurements may be made by placing the probe tip in contact with the sample surface or by placing the probe tip close to the sample surface. As the probe tip is scanned across the surface of the sample, the position of the probe tip may be monitored using a variety of methods. By processing information such as position or force data, an image of the sample surface may be generated.

The probe tips developed for use with atomic force microscopes can be adapted to a range of uses which require the measurement of extremely small objects. One such use can be storing information on a physical medium. Specifically, digital information can be stored in an extremely dense manner by placing very small bumps or holes representing ones or zeroes on the medium. An array of probe tips can be used to read, and in some cases write the stored data.

Existing techniques for fabricating probe cantilevers and tips often use Silicon on Insulator (SOI) wafers. The SOI wafers are quite expensive and can have complex CMOS integration issues. The fabrication and integration process can be cumbersome and expensive, particularly when using probe cantilevers and tips for use in a memory storage device, where a large array of probes may be needed. It is desirable to have a method for inexpensively forming single crystal cantilevers and sharpened tips which can be more simply integrated with CMOS circuitry.

SUMMARY OF THE INVENTION

A method is disclosed for forming a single crystal cantilever and tip on a substrate. The method can include the operation of defining an implant area on the substrate with a layer of photoresist. A further operation can be implanting oxygen into the substrate in the implant area to a predetermined depth to form a buried oxide layer. The buried oxide layer can define a bottom of the single crystal cantilever and tip. Another operation can involve shaping the single crystal cantilever and tip from the substrate above the buried oxide layer.

BRIEF DESCRIPTION OF THE DRAWINGS

FIG. 1 is an illustration showing a cross-sectional view of a semiconductor wafer having an oxide layer in accordance with an embodiment of the present invention;

FIG. 2 is a top view of a portion of the semiconductor wafer of FIG. 1 further showing a photoresist mask defining a plurality of implant areas in accordance with an embodiment of the present invention;

FIG. 5 is a top view of the implant area shown in FIG. 4 further illustrating a cantilever and anchors defined by having the semiconductor material surrounding the cantilever, post, and anchors in the implant area etched away to show the underlying buried oxide layer in accordance with an embodiment of the present invention;

FIG. 6 is a cross sectional view of the implant area of FIG. 5 further illustrating an oxidation process performed to form the post into a sharpened tip, the oxidation process surrounding the exposed portions of the cantilever, post, and anchors with an oxide layer in accordance with an embodiment of the present invention;

DETAILED DESCRIPTION

Figure 3:
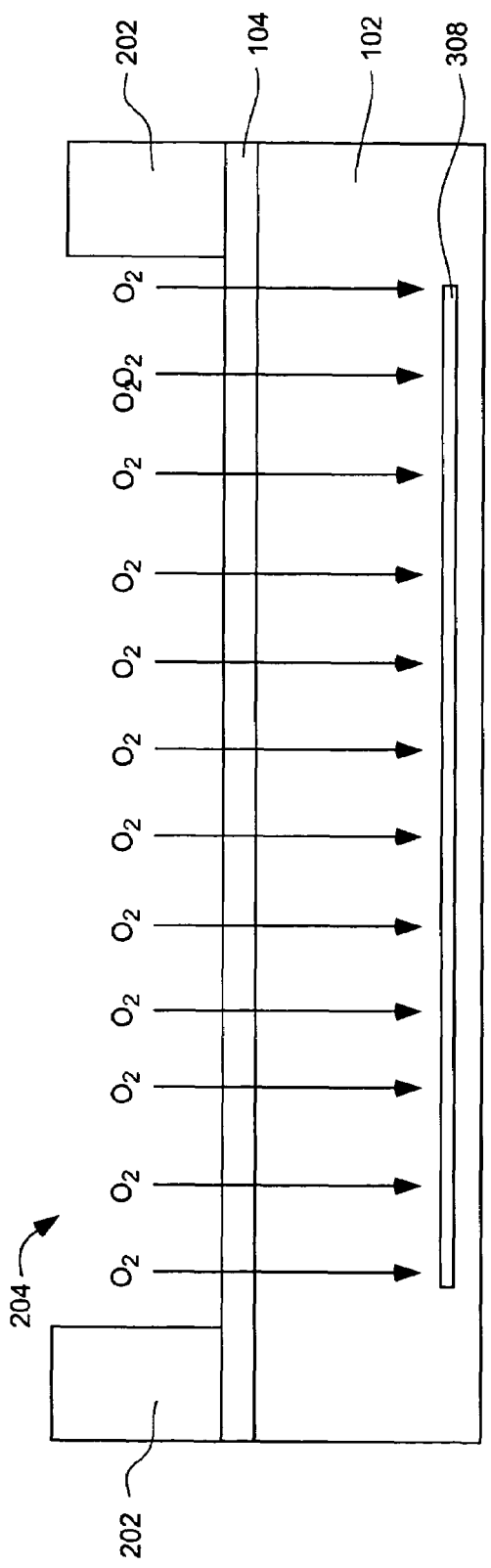
FIG. 3 is a cross sectional view of one implant area shown in FIG. 2 further illustrating a buried oxide layer injected a predetermined distance beneath the surface of the semiconductor in the implant window in accordance with an embodiment of the present invention.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

An array of cantilevers having sharpened tips can be manufactured by taking advantage of a selective high energy oxygen implant process to form a buried oxide layer in an array of areas defined on a substrate. The high energy oxygen implant process can implant the oxygen to a sufficient depth that the cantilever and tip can be formed from the substrate above the buried oxide layer. The depth of the implantation enables the cantilever and tip to be formed without an additional epitaxial layer grown on top of the buried oxide layer.

In one embodiment, a substrate having an oxide layer can be used to form the cantilever and tip. The substrate can be a semiconductor wafer, wherein the wafer is a single crystal. The wafer 102 can have an oxide layer 104 on the top surface of the wafer, as shown in FIG. 1. The semiconductor can be comprised of silicon, gallium arsenide, gallium nitride, indium phosphide, zinc sulfide, germanium, or a combination of the semiconductors. The oxide layer can be a field oxide, a thermally grown oxide layer, or other type of oxide layer.

A thick photoresist 202 can be placed on top of the oxide layer to define a plurality of implant areas 204, as shown in FIG. 2. The implant areas can be spaced a predetermined distance apart. A cantilever and tip can be formed in each of the plurality of implant areas. Thus, an array of cantilevers and tips can be formed on the wafer.

FIG. 3 shows one of the implant areas 204 of FIG. 2 with the thick photoresist 202 defining each side of the implant window. A buried oxide layer 308 can be implanted in each of the implant areas. The buried oxide layer can be created by implanting oxygen at a high energy into the implant area. The thick photoresist 202 can shield the substrate underlying the photoresist from having oxygen implanted therein. The depth of the implantation can be determined by controlling the energy with which ionized oxygen atoms are accelerated toward the substrate.

Figure 23:
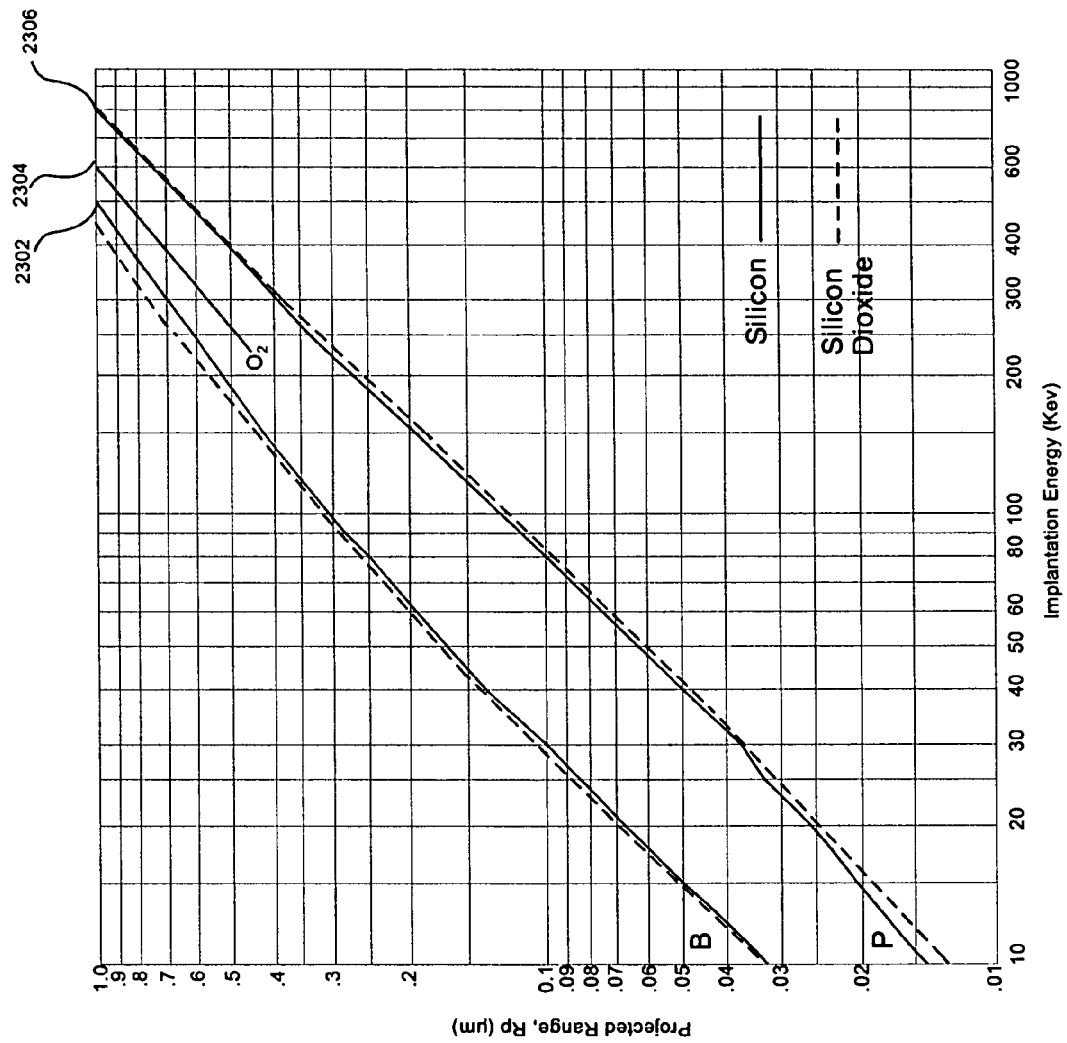
FIG. 23 is a chart showing the theoretical energy necessary to implant oxygen ions to various depths in silicon and silicon dioxide.

In one embodiment, the substrate can be formed of single crystal silicon. FIG. 23 shows a graph depicting measured values for the average depth boron ions 2302 and phosphorous ions 2306 travel through silicon and silicon dioxide substrates at increasing energies. The atomic weight of oxygen, being between those of boron and phosphorous, suggests that an energy of at least 600 kiloelectronvolts (KeV) can be necessary to project oxygen ions to an average depth of 1 micron in silicon. The theoretical oxygen line 2304 is shown between the boron and phosphorous lines. The necessary implant energy can be achieved using commercially available implanters. Oxygen ions can be accelerated to at least 600 KeV and implanted into the silicon wafer, driving the oxygen through the oxide layer 104 and more than one micron into the substrate 102 to form the buried oxide layer 308. Other energies can be used to drive the oxygen a predetermined distance into the substrate, wherein the distance is sufficient to allow a cantilever and tip to be formed from the substrate material above the buried oxide layer without the addition of any epitaxial layer grown on top of the substrate containing the buried oxide layer.

Figure 4:
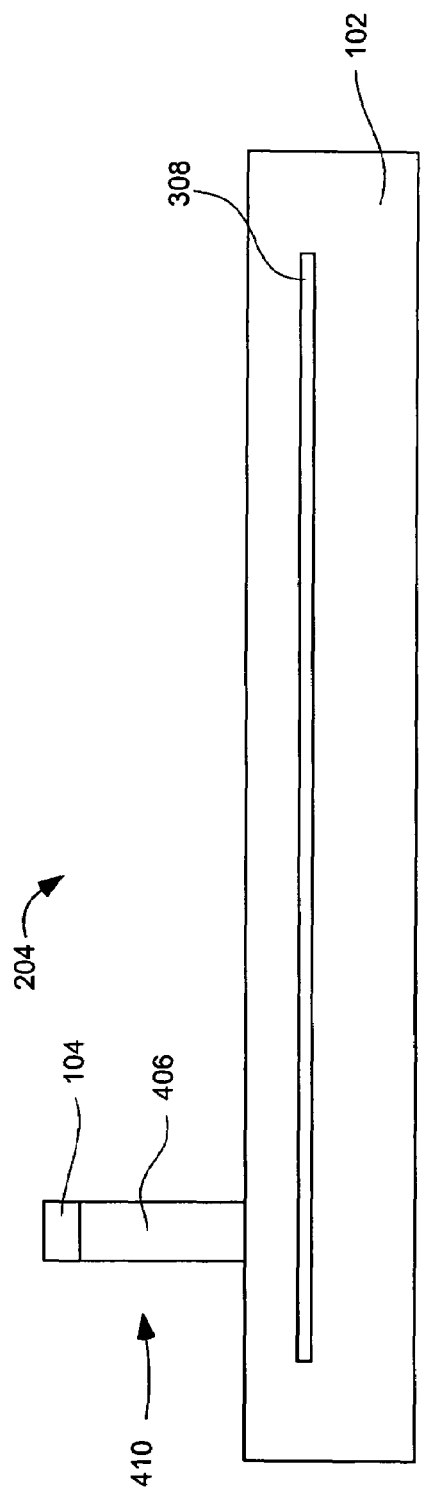
FIG. 4 is a cross sectional view of the implant area shown in FIG. 3 further illustrating a post defined and etched from the semiconductor material in the implant area in accordance with an embodiment of the present invention.

A post area can then be defined using a photoresist. The substrate in the implant area 204 can then be etched a predetermined amount to produce a post 410, as shown in FIG. 4. The post can be used to create the sharpened tip connected to the cantilever. The oxide layer 104 can be left on top of the post substrate 406. The oxide layer can be used in a later step to enable the post to be shaped into a sharpened tip. The post is formed above the buried oxide layer 308, preferably near one end of the buried oxide layer. A predetermined thickness of substrate 102 can remain above the buried oxide layer. The substrate remaining above the buried oxide layer can be used to form a cantilever.

A cantilever area and at least one anchor area can be defined in the implant area 204 using a photoresist, as shown in FIG. 5. The substrate in the implant area that is not covered by the photoresist can be etched down to the buried oxide layer 308, forming a cantilever 505 connected to the post 410, and at least one anchor 508. The cantilever and anchor can be formed from the substrate above the buried oxide layer. In one embodiment, the cantilever can have a first arm 507 and a second arm 506, with each arm being coupled to an anchor 508 at one end of the arms. The other end of the cantilever can be connected to the post 410. The area in the implant area around the post, cantilever, and two anchors can be etched down to the level of the buried oxide layer, leaving the buried oxide layer exposed.

Once the cantilever, post and anchors have been defined, an oxidization process can be used to form a sharpened tip from the post. The oxidization process can involve annealing the silicon. The annealing process can be done in a specialized atmosphere. The atmosphere can have a predetermined amount of one or more gasses and a desired amount of humidity. The atmosphere, humidity, and heat can accelerate the oxidization of the substrate resulting in an oxide layer forming on exposed portions of the substrate.

During the oxidization process, oxygen can diffuse much quicker through the substrate than through an oxide. The amount of oxidization occurring at the post 609, as shown in FIG. 6, can be controlled by the formation of the oxide layer 104 (FIG. 4) on top of the post. The thickness of the oxide layer can control the degree to which the post is oxidized. The oxygen can penetrate through the oxide layer on top of the post more slowly than at the bottom of the post. The oxide layer allows the oxidization of the post to be done in such a way that the silicon remaining in the post which has not been oxidized 610 will form a sharpened tip at the top and a broad base connected to the cantilever 606. The annealing process can also form an oxide layer 608 on the exposed silicon on the post, cantilever, and substrate 102. At this point, the cantilever can be substantially completely surrounded by an oxide layer, with the buried oxide layer 308 beneath the cantilever and an oxide 608 created by the tip sharpening oxidization process present on the exposed upper and side portions of the cantilever and post.

Figure 7A:
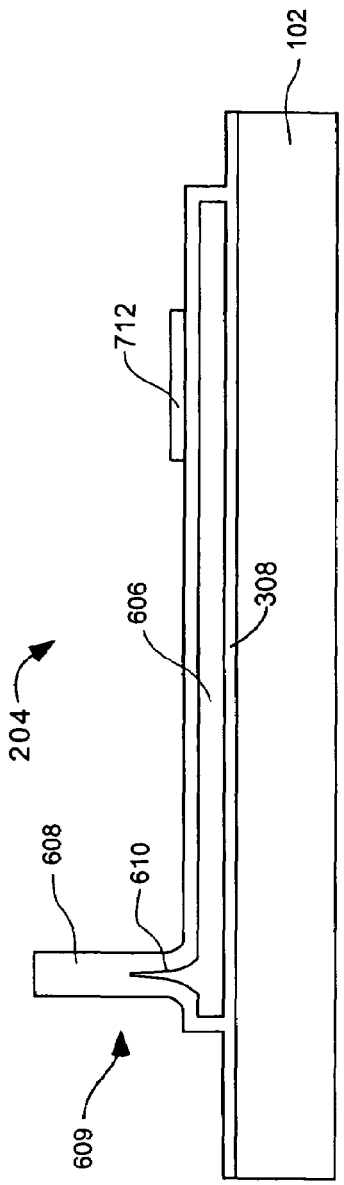
FIGS. 7a and 7b are a cross sectional view and top view respectively of the implant area of FIG. 6, further illustrating a stress nitride deposition patterned and deposited at the junction of the cantilever and anchors in accordance with an embodiment of the present invention.

A stress nitride deposition can be placed at the areas comprising the junction of the cantilever and the anchors. A photoresist mask can be placed around the junctions. Silicon nitride can then be deposited across the junctions. Silicon nitride can be deposited by a chemical vapor deposition (CVD) or plasma-enhanced chemical vapor deposition (PECVD) process. FIG. 7a shows a side view of the implant area 204 having the stress nitride deposition 712 placed on top of the oxide layer 608 on the cantilever 606. The sharpened tip 610 appears below the oxidization layer 608 on the post 609. The buried oxide layer 308 can be located between the cantilever and the substrate 102.

Figure 7B:
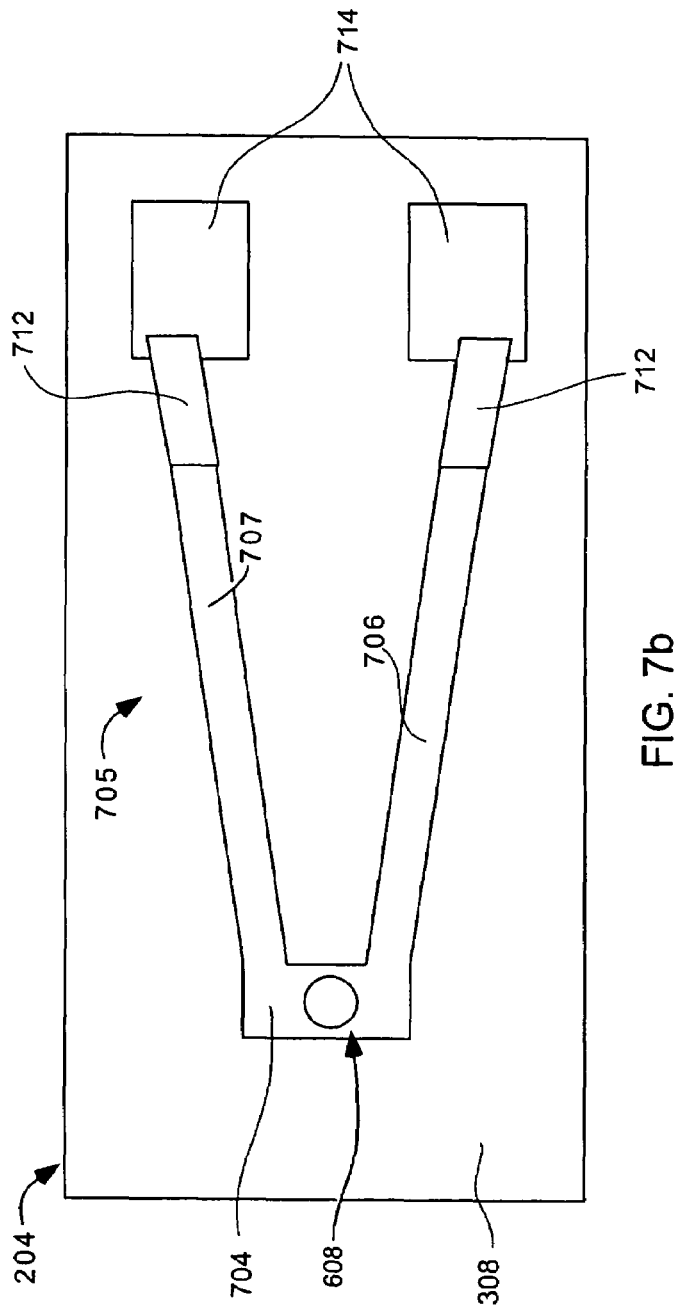

FIG. 7b shows a top down view of the implant area 204 of FIG. 7a. The cantilever 705 is shown comprising an oxidized first arm 706, an oxidized second arm 707, and the oxidized post 608. The cantilever is joined with the oxidized anchors 714. The stress nitride deposition 712 can be seen over the junctions of the cantilever and anchors. The substrate surrounding the cantilever, post, and anchors is covered by the buried oxide layer 308.

Figure 8A:
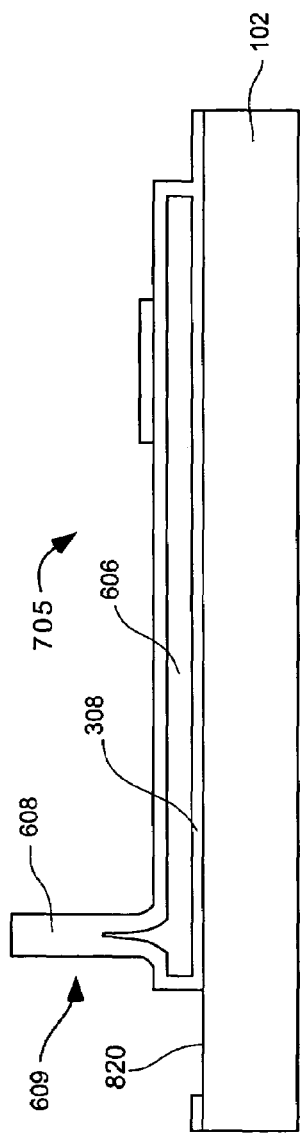
FIGS. 8a and 8b are a cross sectional view and top view respectively of the implant area of FIGS. 7a and 7b further illustrating a patterning and etching of the buried oxide layer from an area surrounding the cantilever and post in accordance with an embodiment of the present invention.
Figure 8B:
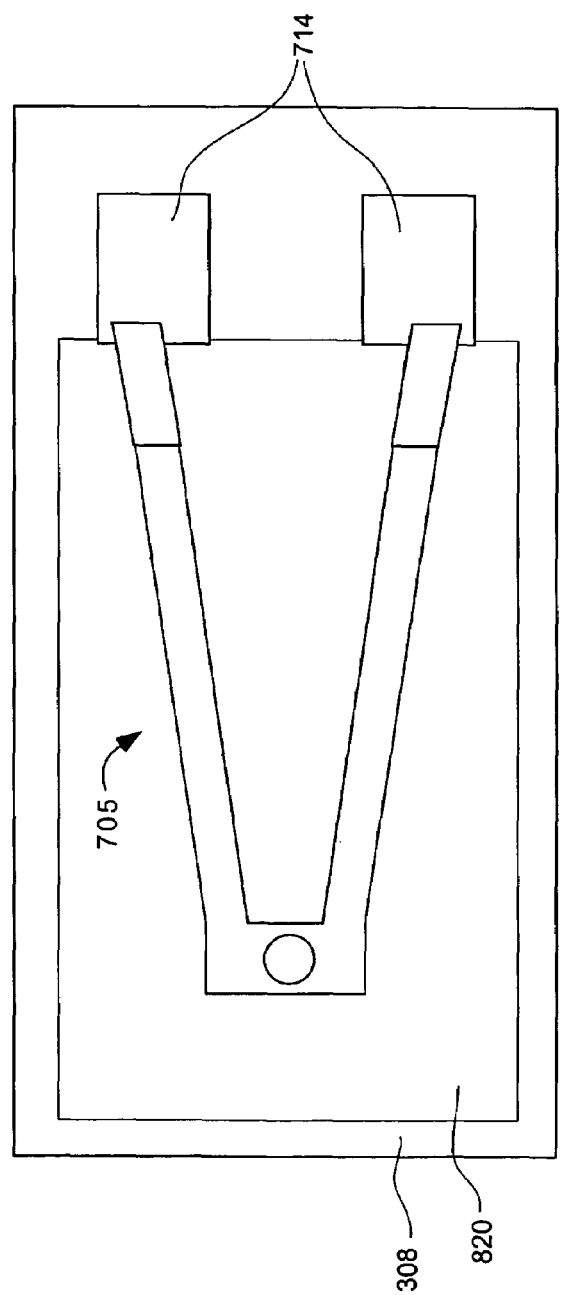

A layer of photoresist can be placed over the cantilever, post, anchors, and stress nitride deposition. An area 820 around the cantilever, including and up to the point where the cantilever 705 is joined to the anchors 714, can be etched to remove the exposed buried oxide layer 308, as shown in FIGS. 8a and 8b. The buried oxide layer underneath the cantilever, post, and anchors can remain substantially undisturbed. After the etching process, the cantilever, post 609, and anchors can remain covered in oxide 608. The etching process can remove the oxide from the area surrounding the cantilever, exposing the substrate 102 beneath the buried oxide layer.

Figure 9:
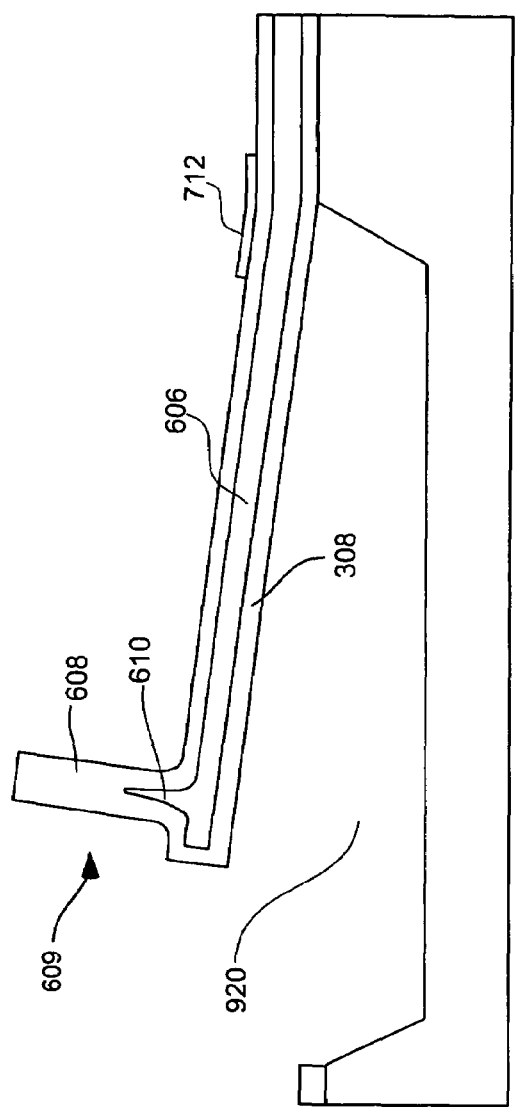
FIG. 9 is a cross sectional view of the implant area of FIGS. 8a and 8b further illustrating the formation of a cavity in the area surrounding the cantilever and the release of the cantilever from the semiconductor below in accordance with an embodiment of the present invention.

A wet etch chemistry can then be used to form a cavity 920 in the area 820 where the oxide was removed (FIGS. 8a and 8b), as shown in FIG. 9. A wet etch chemistry, such as tetramethylammonium hydroxide (TMAH), can etch the exposed substrate while leaving the areas covered in oxide essentially undisturbed. Thus, the area underneath the cantilever 606 and post 609 can be undercut and removed while leaving the cantilever and post intact inside a casing of oxide 608 and the buried oxide layer 308. The cavity etched underneath the cantilever enables the cantilever and post to be released from the substrate below it, allowing the cantilever to move using the stress nitride deposition 712 to flex at the area where the cantilever is connected to the anchor.

Figure 10:
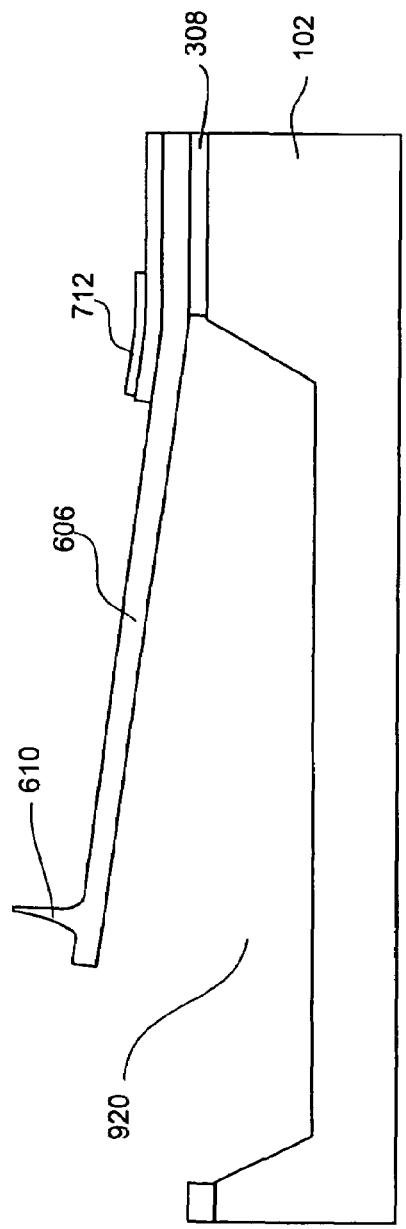
FIG. 10 is a cross sectional view of the implant area of FIG. 9 further illustrating the removal of the oxide layer from the cantilever and post to form a single crystal cantilever and tip in accordance with an embodiment of the present invention.

Finally, the oxide layers 608 and 308 surrounding the cantilever 606 and tip 610 (FIG. 9) can be removed to form a single crystal cantilever 606 and tip 610, as shown in FIG. 10. The oxide layers can be removed using a wet etch with a buffered hydrofluoric acid (HF). The exposed tip can have a radius of 10-50 nanometers. The cavity 920 underneath the cantilever, along with the stress nitride deposition 712, can enable the cantilever to flexibly bend. This allows the cantilever and tip to be used to measure extremely small changes in surface texture. The cantilever is connected to the substrate 102 through the buried oxide layer 308 beneath the anchors.

In another embodiment, the post used to form the sharpened tip of the cantilever can be formed prior to injecting oxygen into the substrate. Forming the post prior to injecting oxygen into the substrate can allow the oxygen to be injected into the substrate at a shallower depth. This will be explained more fully below.

Figure 11:
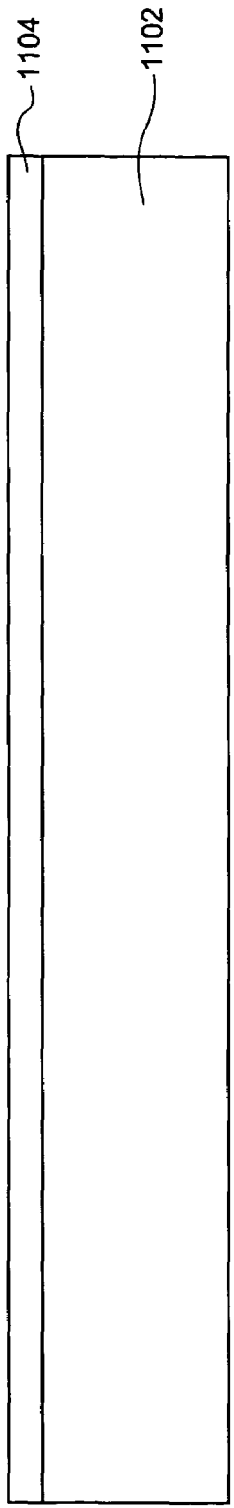
FIG. 11 is an illustration showing a cross-sectional view of a semiconductor wafer having an oxide layer in accordance with an embodiment of the present invention.
Figure 12:
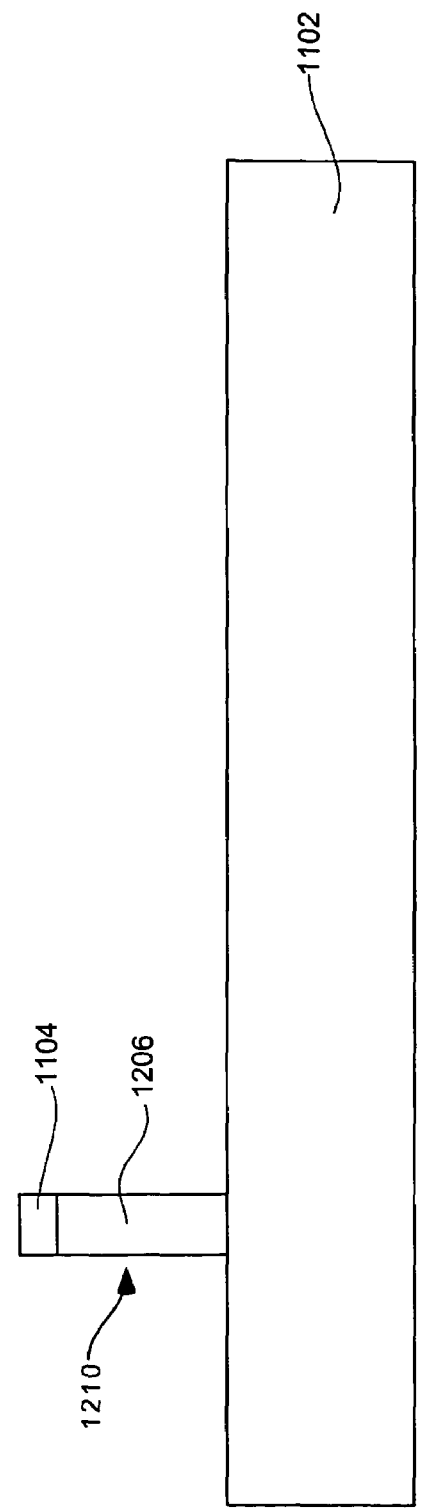
FIG. 12 is a cross-sectional view of the semiconductor wafer shown in FIG. 11 further illustrating a post defined and etched from the semiconductor material in an implant area in accordance with an embodiment of the present invention.

In this embodiment, a substrate wafer 1102, having an oxide layer 1104, can have a photoresist layer applied and the exposed areas of the substrate etched to form a post 1210 above the substrate 1102, as shown in FIGS. 11 and 12. The post can comprise a portion of substrate 1206 etched from the surrounding substrate to form the post, with the oxide layer 1104 remaining at the top of the post. This process can be used to form a plurality of posts upon the substrate wafer 1102. A thick layer of photoresist 1302 can be used to define a plurality of implant windows 1304 around the posts 1210, as shown in FIG. 13.

Figure 13:
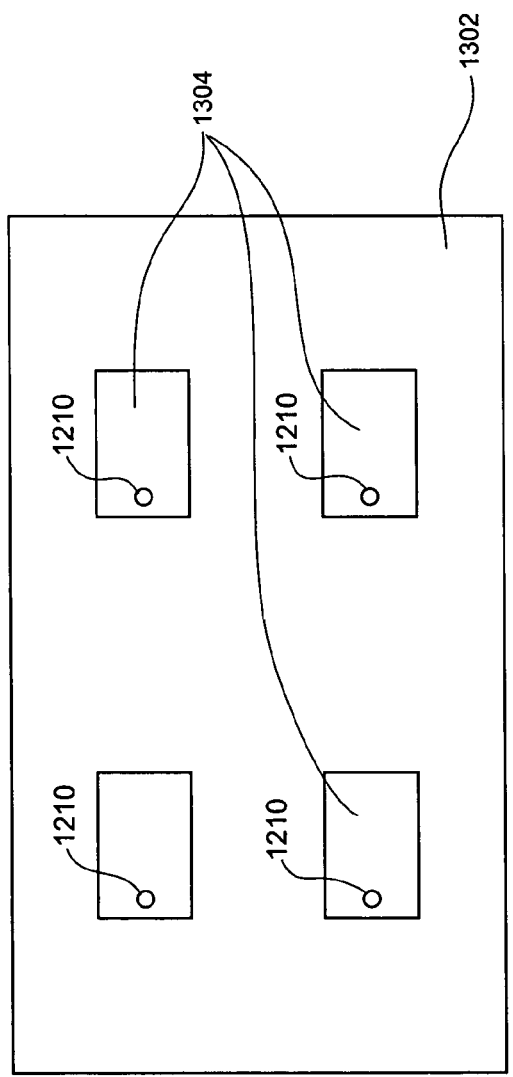
FIG. 13 is a top view of a portion of the semiconductor wafer of FIG. 12 further showing a photoresist mask defining a plurality of implant areas, each having a post in accordance with an embodiment of the present invention.
Figure 14:
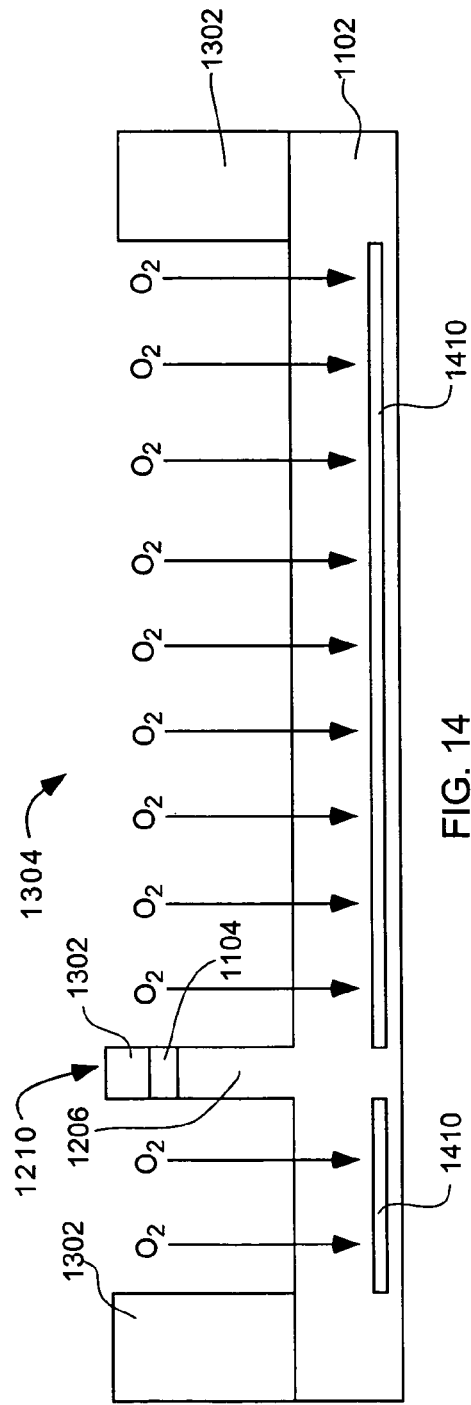
FIG. 14 is a cross sectional view of one implant area shown in FIG. 13 further illustrating a buried oxide layer injected a predetermined distance beneath the surface of the semiconductor in the implant window, with the exception of the area beneath the post, in accordance with an embodiment of the present invention.

FIG. 14 shows one of the implant areas 1304 of FIG. 13 with the thick photoresist 1302 defining each side of the implant window. As previously discussed, a buried oxide layer 1410 can be implanted in each of the implant areas. The buried oxide layer can be created by implanting oxygen at a high energy into the implant area. The thick photoresist can shield the remaining substrate from having oxygen implanted. The depth of the implantation can be determined by controlling the energy with which ionized oxygen atoms are accelerated toward the substrate wafer.

In one embodiment, the substrate can be formed of a single silicon crystal. As previously discussed, the atomic weight of oxygen suggests that at least 600 Kiloelectronvolts (KeV) can be required to project oxygen ions to an average depth of 1 micron in silicon. This implant energy can be achieved using commercially available implanters. Oxygen ions can be accelerated to at least 600 KeV and implanted into the silicon wafer, driving the oxygen more than one micron into the substrate 1102 to form the buried oxide layer 1410.

A variety of energies can be used to drive the oxygen a predetermined distance into the substrate, either less than or greater than one micron, wherein the distance is sufficient to allow a cantilever and tip to be formed from the substrate material above the buried oxide layer without the addition of any epitaxial layer grown on top of the substrate containing the buried oxide layer.

In the present embodiment, the post 1210 was created before the oxygen was implanted into the substrate. The etched post 1206 can have the oxide layer 1104 remain on top of the post, with a thick layer of photoresist 1302 placed on top of the oxide layer. The thick photoresist layer on top of the post keeps the oxygen from being implanted either in the post or directly below the post. The oxide layer that remains on top of the post can enable the post to be shaped into a sharpened tip.

Figure 15:
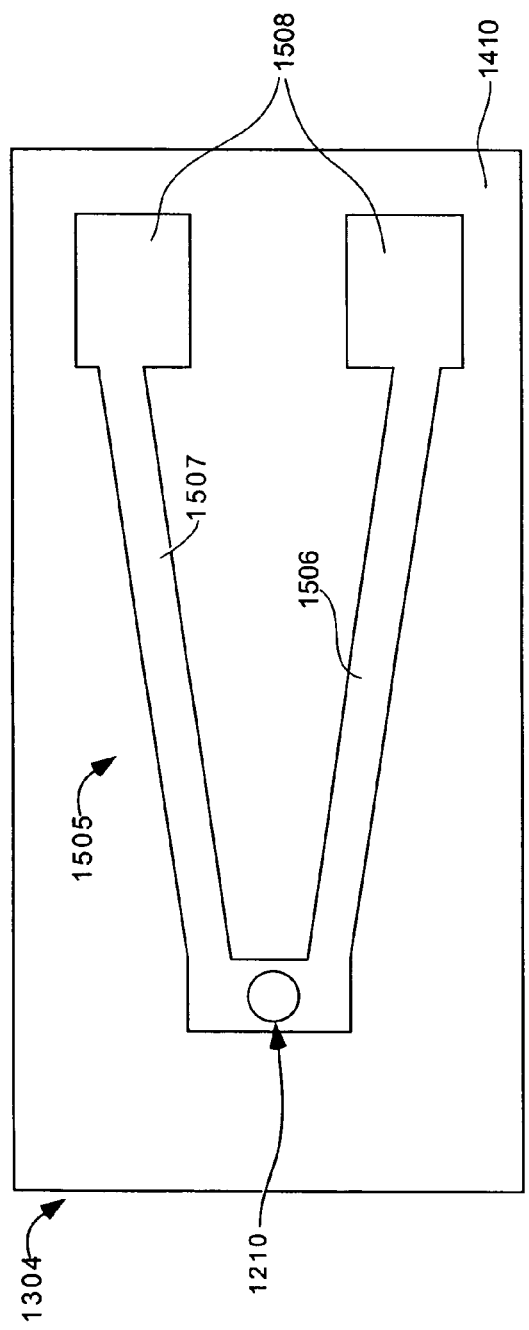
FIG. 15 is a top view of the implant area shown in FIG. 14 further illustrating a cantilever and anchors defined by having the semiconductor material surrounding the cantilever, post, and anchors in the implant area etched away to show the underlying buried oxide layer in accordance with an embodiment of the present invention.

A cantilever area and at least one anchor area can be defined in the implant area 1304 using a photoresist. The substrate in the implant area that is not covered by the photoresist can be etched down to the buried oxide layer 1410, as shown in FIG. 15. The cantilever 1505 is shown having a first arm 1506 and a second arm 1507, wherein each arm is coupled to an anchor 1508 at one end of the cantilever. The other end of the cantilever can be connected to the post 1210. The area in the implant area around the post, cantilever, and two anchors can be etched down to the level of the buried oxide layer 1410.

Once the cantilever, post, and anchors have been defined, an oxidization process can be used to form a sharpened tip from the post. The oxidization process can be applied to the wafer as previously discussed. The atmosphere can have a predetermined amount of gasses and humidity. The atmosphere, humidity, and heat can accelerate the oxidization of the substrate resulting in an oxide layer forming on the substrate.

Figure 16:
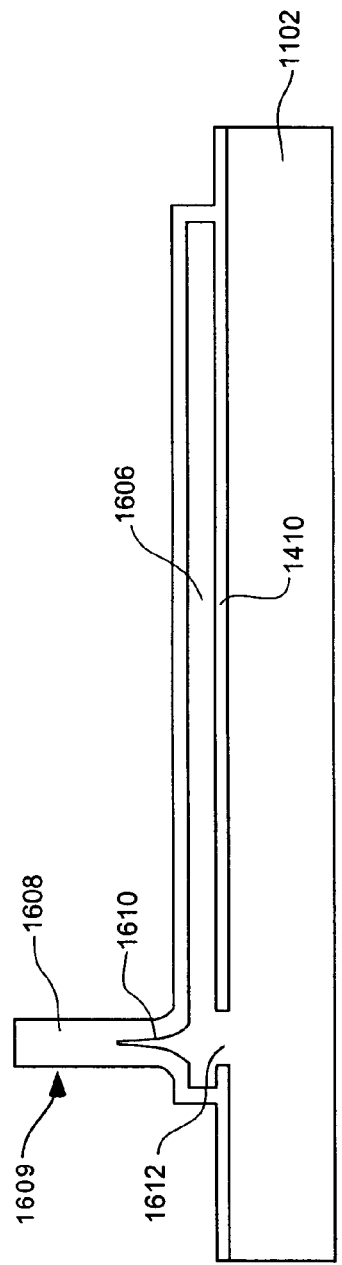
FIG. 16 is a cross sectional view of the implant area of FIG. 15 further illustrating an oxidation process carried out to form the post into a sharpened tip, the oxidation process surrounding the cantilever and anchors with an oxide layer in accordance with an embodiment of the present invention.

During the oxidization process, oxygen can diffuse much quicker through the substrate than through an oxide. The amount of oxidization occurring at the post 1609, as shown in FIG. 16, can be controlled by the shape of the oxide layer 1104 (FIG. 14) on top of the post. The thickness of the oxide layer can control the degree to which the post is oxidized. The oxygen can penetrate the top of the post more slowly than at the bottom of the post. The oxide layer allows the oxidization of the post to be done in such a way that the silicon remaining in the post which hasn't been oxidized 1610 can form a sharpened tip at the top and a broad base connected to the cantilever 1606. The annealing process can also form an oxide layer 1608 on top of the exposed silicon on the post, cantilever, and substrate 1102. At this point, the cantilever can be substantially completely surrounded by an oxide layer, with the buried oxide layer 1410 beneath the cantilever and the oxidization caused by the tip sharpening process present on the exposed upper and side portions of the cantilever and post. The area directly beneath the post 1612 does not have any oxide since the post was created before the oxygen was implanted in this embodiment.

As previously discussed, the buried oxide layer 1410 can be formed at a shallower depth in this embodiment. The shallower depth can be used since the post 1609 is etched from the substrate prior to the oxygen implantation to form the buried oxide layer. Thus, the buried oxide layer only needs to be deep enough to allow formation of the cantilever 1606 above the buried oxide layer.

Figure 17A:
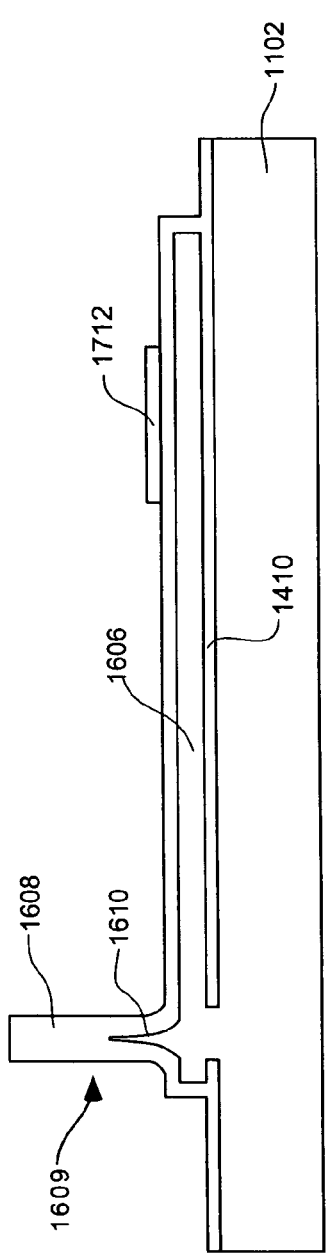
FIGS. 17a and 17b are a cross sectional view and top view respectively of the implant area of FIG. 16, further illustrating a stress nitride deposition patterned and deposited at the junction of the cantilever and anchors in accordance with an embodiment of the present invention.

A stress nitride deposition can be placed at the areas comprising the junction of the cantilever and the anchors. A photoresist mask can be placed around the junctions and silicon nitride can be deposited across the junctions. Silicon nitride can be deposited by a chemical vapor deposition (CVD) or plasma-enhanced chemical vapor deposition (PECVD) process. FIG. 17a shows a side view of the implant area having the stress nitride deposition 1712 placed on top of the oxide layer 1608 on the cantilever 1606. The original post 1609 can be oxidized such that the sharpened tip 1610 exists below the oxidized layer on the post.

Figure 17B:
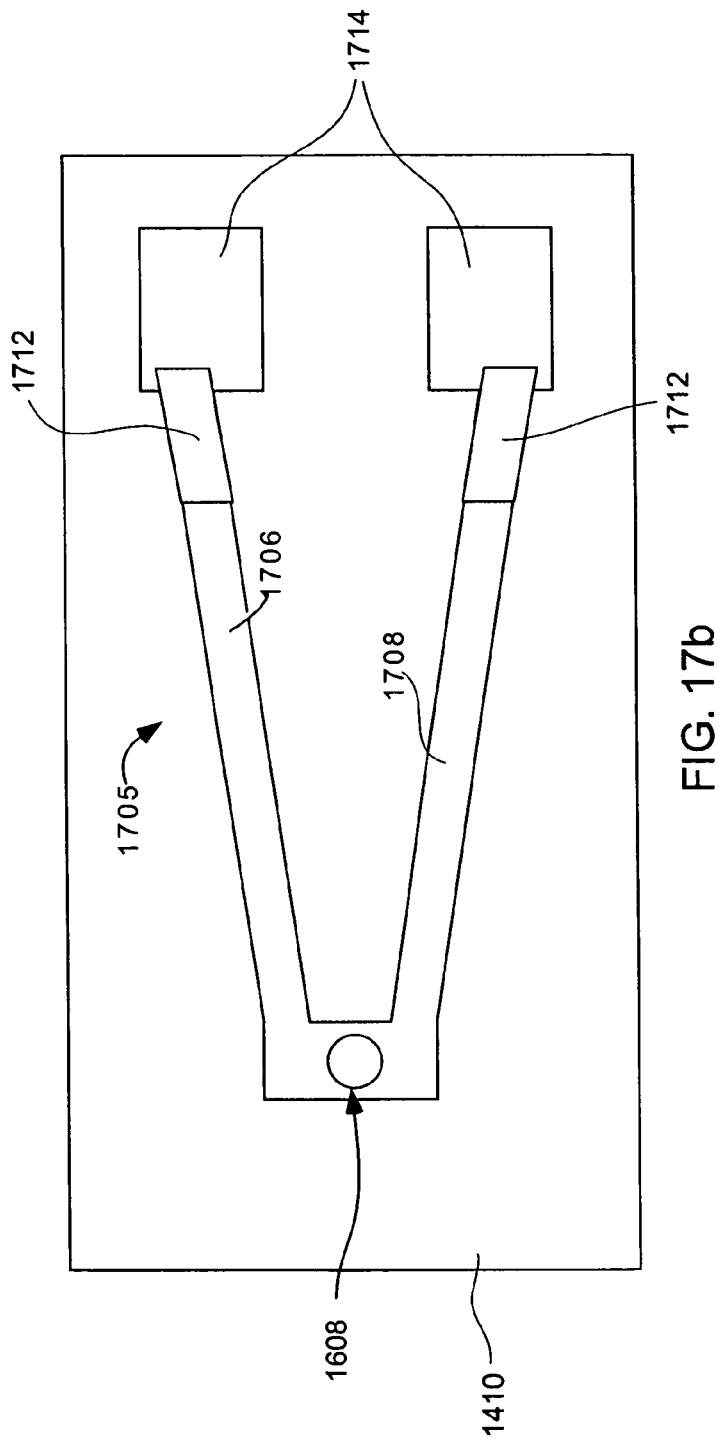

FIG. 17b shows a top down view of FIG. 17a. The oxidized cantilever 1705, arms 1706 and 1708, post 1608, and anchors 1714 are shown. The stress nitride deposition 1712 can be seen over the junctions of the cantilever and anchors. The substrate surrounding the cantilever, post, and anchors is covered by the buried oxide layer 1410.

Figure 18A:
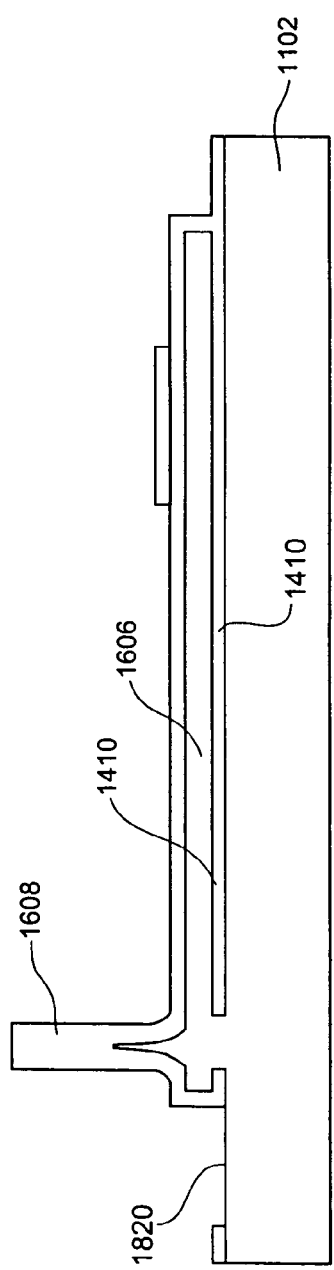
FIGS. 18a and 18b are a cross sectional view and top view respectively of the implant area of FIGS. 17a and 17b further illustrating a patterning and etching of the buried oxide layer from an area surrounding the cantilever and post to expose the semiconductor below in accordance with an embodiment of the present invention.
Figure 18B:
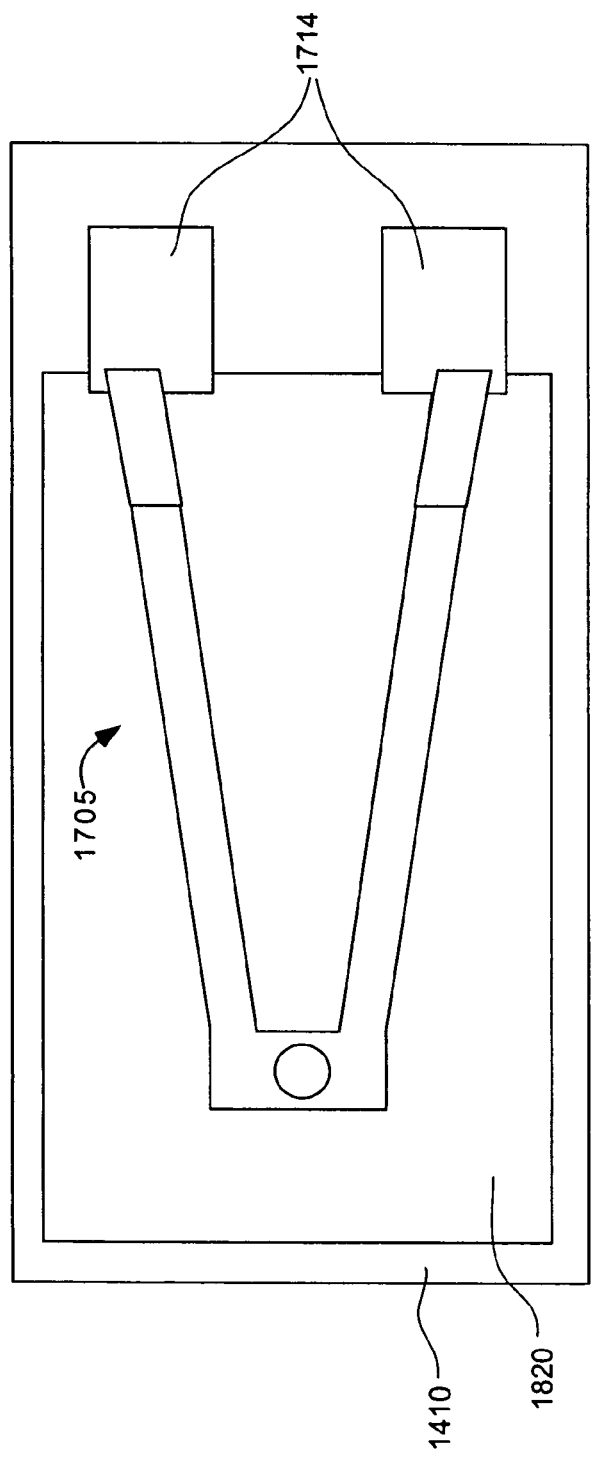

A layer of photoresist can be placed over the cantilever, post, anchors, and stress nitride deposition. An area 1820 around the cantilever, including and up to the point where the oxidized cantilever 1705 is joined to the anchors 1714 can be etched to remove the exposed buried oxide layer, as shown in FIGS. 18a and 18b. The buried oxide layer 1410 underneath the cantilever and anchors can remain substantially undisturbed. The etching process can remove the oxide from the area surrounding the cantilever, exposing the substrate 1102 beneath the buried oxide layer 1410.

Figure 19:
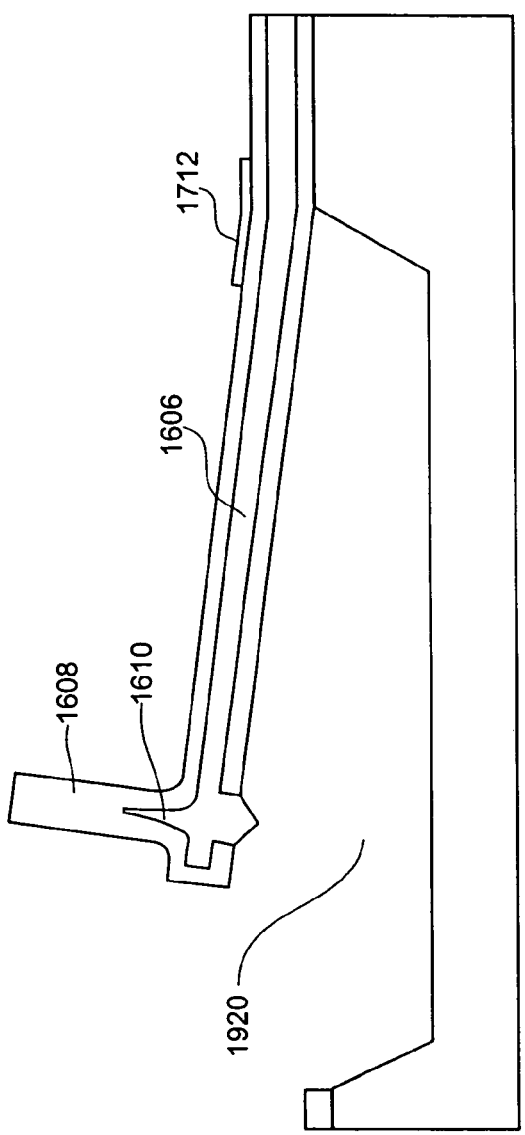
FIG. 19 is a cross sectional view of the implant area of FIGS. 18a and 18b further illustrating the formation of a cavity in the area surrounding the cantilever and the release of the cantilever from the semiconductor below in accordance with an embodiment of the present invention.

A wet etch chemistry can then be used to form a cavity 1920 in the area where the oxide was removed, as shown in FIG. 19. A wet etch chemistry, such as tetramethylammonium hydroxide can etch the exposed substrate while leaving the areas covered in oxide essentially undisturbed. Thus, the area underneath the cantilever 1606 and post 1609 can be removed while leaving the cantilever intact inside a casing of oxide 1608. The area underneath the post can be cut from the silicon below it using the wet etch process. The cavity etched underneath the cantilever can enable the cantilever to move, using the stress nitride deposition 1712 to flex at the area where the cantilever is connected to the anchor.

Figure 20:
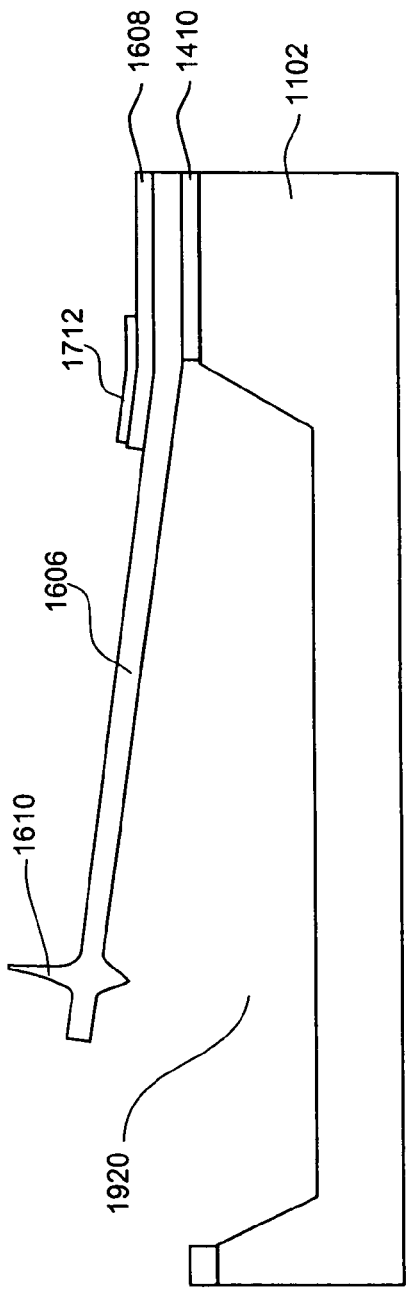
FIG. 20 is a cross sectional view of the implant area of FIG. 19 further illustrating the removal of the oxide layer from the cantilever and post to form a single crystal cantilever and tip in accordance with an embodiment of the present invention.

Finally, the buried oxide layer 1410 and the oxide layer 1608 surrounding the cantilever 1606 and tip 1610 (FIG. 19) can be removed to form a single crystal cantilever and tip, as shown in FIG. 20. The cantilever is connected to the substrate 1102 through the buried oxide layer 1410 beneath the anchors. The exposed tip can have a radius of 10-50 nanometers. The cavity 1920 underneath the cantilever and the stress nitride deposition 1712 can enable the cantilever to flexibly bend. This allows the cantilever and tip to be used to measure extremely small changes in surface texture.

Figure 21:
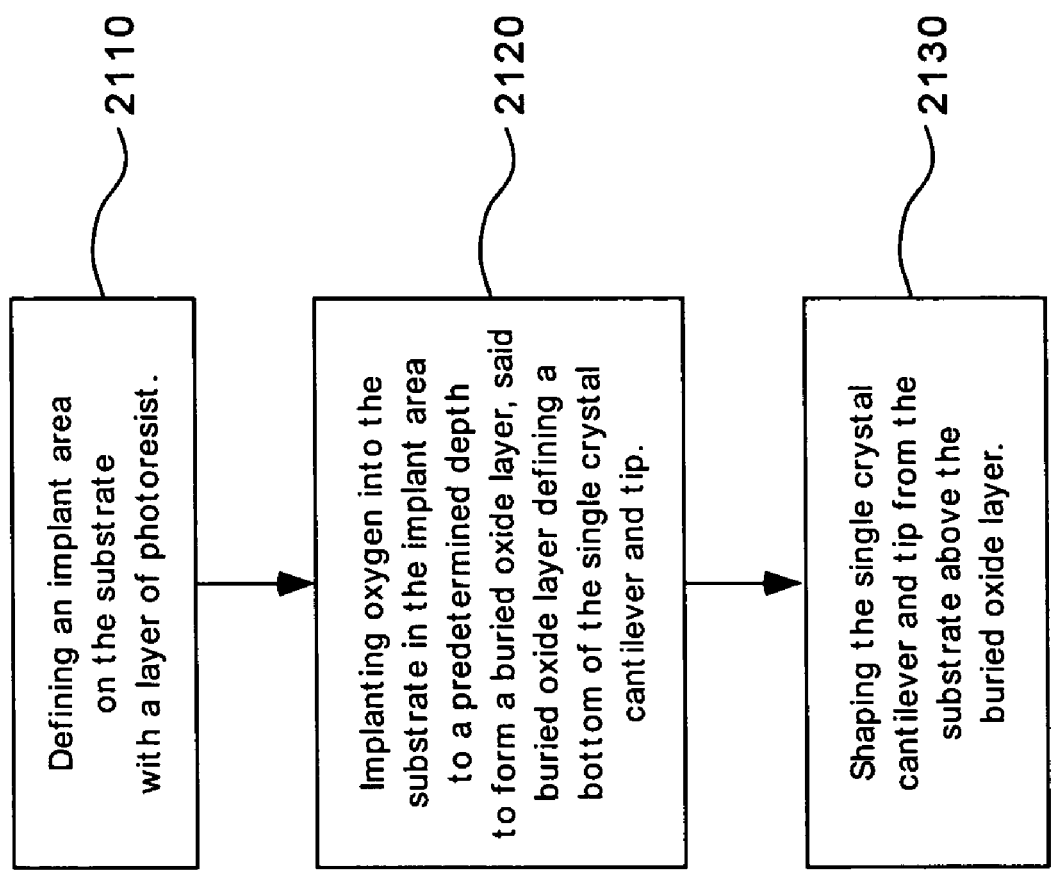
FIG. 21 is a flow chart depicting a method for forming a single crystal cantilever and tip on a substrate, in accordance with and embodiment of the present invention.

Another embodiment of the invention provides a method for forming a single crystal cantilever and tip on a substrate, as depicted in the flow chart of FIG. 21. The method includes the operation of defining an implant area on the substrate with a layer of photoresist, as shown in block 2110. The photoresist can be used to define a plurality of implant areas. The implant areas can be arranged in an array on the substrate. A further method involves implanting oxygen into the substrate in the implant area to a predetermined depth to form a buried oxide layer, said buried oxide layer defining a bottom of the single crystal cantilever and tip, as shown in block 2120. Another step involves shaping the single crystal cantilever and tip from the substrate above the buried oxide layer, as shown in block 2130.

Figure 22:
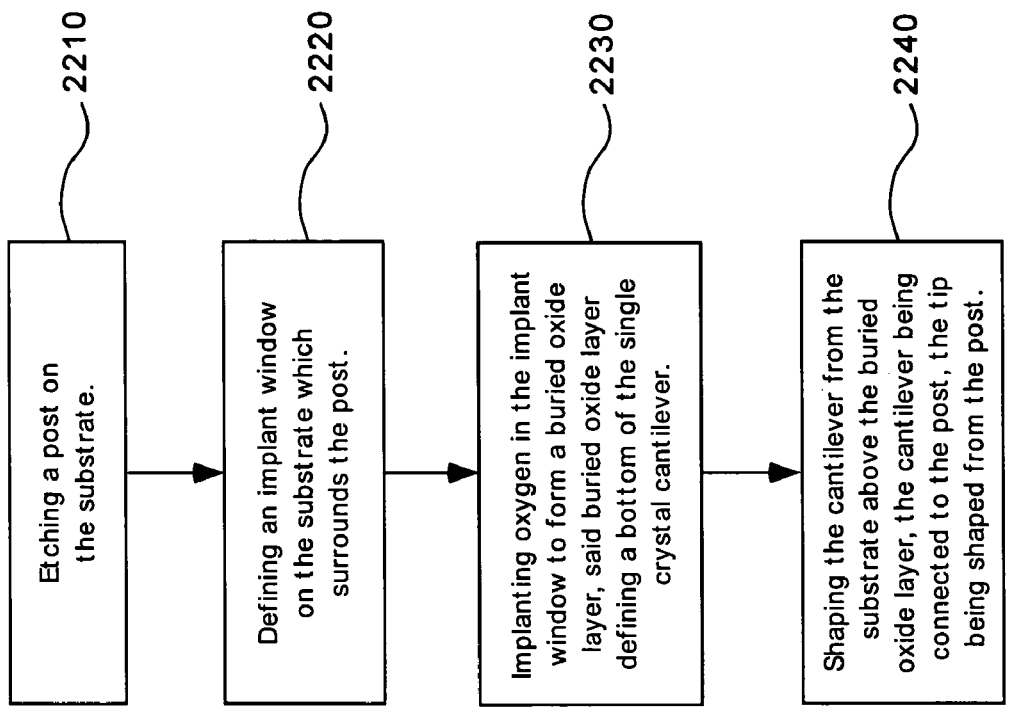
FIG. 22 is a flow chart depicting a process for fabricating a single crystal cantilever and tip on a substrate.

A further embodiment of the invention provides a process for fabricating a single crystal cantilever and tip on a substrate, wherein a post used to form the tip is etched into the substrate prior to oxygen being implanted. The process is depicted in the flow chart of FIG. 22. The process includes the operation of etching a post on the substrate, as shown in block 2210. A further operation can be defining an implant window on the substrate which surrounds the post, as shown in block 2220. A plurality of implant windows can be defined on the substrate using a photoresist mask. Another operation can involve implanting oxygen in the implant window to form a buried oxide layer, as shown in block 2230. The buried oxide layer can define a bottom of the single crystal cantilever. A further operation can be shaping the cantilever from the substrate above the buried oxide layer, the cantilever being connected to the post, the tip being shaped from the post, as shown in block 2240. The shaping can be done using a photoresist and etching. The post can be sharpened using an oxidization process. A cavity can be formed beneath the cantilever and tip using a wet etch chemistry, such as tetramethylammonium hydroxide.

The present invention enables a large number of cantilevers having sharpened tips to be formed in a small area of the substrate. The method allows the cantilevers to be formed by taking advantage of a selective high energy oxygen implant process to form a buried oxide layer. The high energy oxygen implant process can implant the oxygen to a sufficient depth that the cantilever and tip can be formed from the substrate above the buried oxide layer. The depth of the implantation enables the cantilever and tip to be formed without an additional epitaxial layer grown on top of the buried oxide layer. Thus, the present invention allows the cantilevers to be formed using less material and fewer steps, which provides a more cost effective manufacturing process.

It is to be understood that the above-referenced arrangements are illustrative of the application for the principles of the present invention. It will be apparent to those of ordinary skill in the art that numerous modifications can be made without departing from the principles and concepts of the invention as set forth in the claims.

What is claimed is:

1. A method for forming a single crystal cantilever and tip on a substrate, comprising:
    defining an implant area on the substrate with a layer of photoresist;
    defining a post area located in the implant area;
    masking the post area with a layer of photoresist;
    etching away the substrate in the implant area around the post area to form a post
    implanting oxygen into the substrate in the implant area to a predetermined depth to form a buried oxide layer, said buried oxide layer defining a bottom of the single crystal cantilever and tip, wherein the layer of photoresist substantially prevents oxygen from being implanted in the post; and
    shaping the single crystal cantilever and tip from the substrate above the buried oxide layer.

2. A method as in claim 1, wherein implanting oxygen further comprises implanting oxygen into the substrate in the implant area to a depth sufficient to form the single crystal cantilever from the substrate above the buried oxide layer.

3. A method as in claim 1, wherein defining an implant area further comprises defining a plurality of implant areas on the substrate with a layer of photoresist.

4. A method as in claim 1, further comprising forming a single crystal cantilever and tip where the substrate is selected from at least one of silicon, gallium arsenide, gallium nitride, indium phosphide, zinc sulfide, and germanium.

5. A method as in claim 1, further comprising covering the post area with a thermally grown layer of oxide prior to implanting oxygen.

6. A method as in claim 1, wherein implanting oxygen further comprises implanting oxygen into the implant area with an ion implant device configured to implant oxygen into the substrate.

7. A method as in claim 6, further comprising implanting oxygen into the implant area to a depth of at least one micron.

8. A method as in claim 6, further comprising implanting oxygen into the implant area with an implantation energy of at least 600 kiloelectronvolts.

9. A method as in claim 1, wherein shaping the single crystal cantilever further comprises:
    defining a cantilever and two anchor areas connected to the post area and located in the implant area and above the buried oxide layer;
    masking the post, cantilever, and two anchor areas with a layer of photoresist; and
    etching the substrate in the implant area around the cantilever, post and two anchor areas down to the buried oxide layer.

10. A method as in claim 9, wherein forming a cantilever further comprises annealing the substrate to oxidize the post to form a sharpened tip from the post.

11. A method as in claim 10, wherein annealing the substrate further comprises correcting damages in the substrate caused by the implanted oxygen.

12. A method as in claim 10, further comprising:
    defining a stress nitride area located where the cantilever area intersects the two anchor areas; and
    depositing a layer of silicon nitride on the stress nitride area.

13. A method as in claim 12, further comprising:
    depositing a layer of photoresist on substantially all of the post area, cantilever area, and two anchor areas; and
    etching away oxide in the implant area that is not covered with the layer of photoresist.

14. A method as in claim 12, further comprising:
    depositing a layer of silicon nitride on the stress nitride area using a process selected from the group consisting of chemical vapor deposition and plasma enhanced chemical vapor deposition.

15. A method as in claim 14, further comprising:
    undercutting the cantilever and post areas to form a cantilever and post connected to at least one anchor; and
    releasing the cantilever and post.

16. A method as in claim 15, further comprising undercutting the cantilever and post areas with tetramethylammonium hydroxide.

17. A method as in claim 15, further comprising removing oxide from the cantilever and post to form a single crystal cantilever having a sharpened tip.

18. A method as in claim 17, further comprising removing the oxide from the cantilever and post using a wet etch with a buffered oxide etch.

19. A process for fabricating a single crystal cantilever and tip on a substrate, the process comprising:
    etching a post on the substrate;
    defining an implant window on the substrate which surrounds the post;
    implanting oxygen in the implant window to form a buried oxide layer, said buried oxide layer defining a bottom of the single crystal cantilever; and
    shaping the cantilever from the substrate above the buried oxide layer, the cantilever being connected to the post, the tip being shaped from the post.

20. A process as in claim 19, wherein etching a post on the substrate further comprises:
    defining a post area located on the substrate; and
    etching a portion of the substrate surrounding the post area to a depth sufficient to enable the post to form a sharpened tip above the etched portion of the substrate.

21. A process as in claim 19, wherein implanting oxygen in the implant window further comprises implanting oxygen ions into the substrate in the implant window to a depth sufficient to enable the single crystal cantilever to be formed above the buried oxide layer.

22. A process as in claim 19, wherein shaping the cantilever further comprises:
    defining a cantilever having a first side and a second side, the first side being connected to the post;

defining at least one anchor area connected to the second side of the cantilever, the second side being opposite the first side;

masking the post, cantilever, and at least one anchor area with a layer of photoresist; and etching the substrate in the implant window around the cantilever, post, and at least one anchor area down to the buried oxide layer.

* * * * *